United States Patent
Park et al.

(10) Patent No.: US 12,191,831 B2
(45) Date of Patent: Jan. 7, 2025

(54) AMPLIFYING DEVICE HAVING HIGH INPUT IMPEDANCE

(71) Applicant: Seoul National University R&DB Foundation, Seoul (KR)

(72) Inventors: Junyoung Park, Seoul (KR); Suhwan Kim, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 465 days.

(21) Appl. No.: 17/592,274

(22) Filed: Feb. 3, 2022

(65) Prior Publication Data

US 2022/0255517 A1 Aug. 11, 2022

(30) Foreign Application Priority Data

Feb. 8, 2021 (KR) ........................ 10-2021-0017462

(51) Int. Cl.
*H03F 1/02* (2006.01)
*H03F 1/26* (2006.01)
*H03F 3/45* (2006.01)

(52) U.S. Cl.
CPC ........... *H03F 3/45475* (2013.01); *H03F 1/26* (2013.01); *H03F 2200/261* (2013.01); *H03F 2203/45512* (2013.01)

(58) Field of Classification Search
CPC .. H03F 3/45475; H03F 1/26; H03F 2200/261; H03F 2203/45512; H03F 3/393; H03F 3/005; H03F 3/211; H03F 2200/222; H03F 2200/411; H03F 2203/45138; H03F 1/02; H03F 1/303

USPC ............... 330/9, 85, 99, 101, 103, 104, 291
See application file for complete search history.

(56) References Cited

U.S. PATENT DOCUMENTS

| | | | |
|---|---|---|---|
| 8,120,422 B1* | 2/2012 | Huijsing | H03F 3/387 327/124 |
| 8,179,195 B1* | 5/2012 | Huijsing | H03F 3/45941 330/126 |
| 9,197,173 B2 | 11/2015 | Denison et al. | |
| 9,615,744 B2 | 4/2017 | Denison et al. | |
| 2020/0099352 A1* | 3/2020 | Chandrakumar | A61B 5/24 |

(Continued)

FOREIGN PATENT DOCUMENTS

KR 1020150047663 A 5/2015

OTHER PUBLICATIONS

Qinwen Fan et al., A 1.8 µW 60 nV / √Hz Capacitively-Coupled Chopper Instrumentation Amplifier in 65 nm CMOS for Wireless Sensor Nodes, IEEE Journal of Solid-State Circuits, vol. 46, No. 7, Jul. 2011, pp. 1534-1543.

(Continued)

*Primary Examiner* — Khanh V Nguyen
(74) *Attorney, Agent, or Firm* — William Park & Associates Ltd.

(57) ABSTRACT

An amplifying device includes a main amplifier; a first feedback circuit coupled between an input terminal of the main amplifier and an output terminal of the main amplifier; an input coupling circuit coupled between the input terminal of the main amplifier and a first node; and an amplifying feedback circuit coupled between the output terminal of the main amplifier and the first node, wherein the first feedback circuit and the amplifying feedback circuit are negative feedback circuits.

10 Claims, 7 Drawing Sheets

(56) References Cited

U.S. PATENT DOCUMENTS

2022/0071544 A1* 3/2022 Kim .................. H03F 3/387

OTHER PUBLICATIONS

Qinwen Fan et al., A 1.8 µW 60 nV/√Hz Capacitively-Coupled Chopper Instrumentation Amplifier in 65 nm CMOS for Wireless Sensor Nodes, IEEE Journal of Solid-State Circuits, vol. 46, No. 7, pp. 1534-1543, Jul. 2011, Delft University of Technology.

* cited by examiner

<Prior Art>

AMPLIFYING DEVICE HAVING HIGH INPUT IMPEDANCE

CROSS-REFERENCE TO RELATED APPLICATIONS

The present application claims priority under 35 U.S.C. § 119(a) to Korean Patent Application No. 10-2021-0017462, filed on Feb. 8, 2021, which is incorporated herein by reference in its entirety.

BACKGROUND

1. Technical Field

Various embodiments generally relate to an amplifying device, and more particularly, to an amplifying device in which an input impedance is increased.

2. Related Art

With the advent of the Internet of Things (IoT), demand for mobile or wearable devices is increasing.

These devices contain a variety of sensors.

For example, in a resistor-type pressure sensor, when pressure or force is applied, resistance of the pressure sensor changes and the output voltage of the pressure sensor changes.

A read-out integrated circuit (ROIC) receives an analog output of the pressure sensor and converts the analog output into a digital output.

The ROIC includes an amplifying device that receives the analog output of the pressure sensor at the input terminal and amplifies the same. An instrumentation amplifier (IA) is an example of such an amplifying device.

Recently, sensitivity of a sensor has been improved. For example, in the case of the pressure sensor, the change in resistance becomes larger relative to change in pressure, which means that range of the output voltage becomes larger accordingly.

In order to use a sensor with high sensitivity, the ROIC must be able to read sensor resistance having a large initial value well.

A conventional amplifying device use three or more operational amplifiers to increase input impedance, which increases power consumption and is weak in noise.

FIG. 1 is a circuit diagram showing a conventional amplifying device 1. Such an amplifying device 1 is also referred to as a capacitively-coupled amplifying device 1.

The conventional amplifying device 1 includes a main amplifier 10, a first feedback circuit 20, an input coupling circuit 30, and a bias circuit 40.

The main amplifier 10 is a differential amplifier and includes differential input terminals and differential output terminals.

The first feedback circuit 20 forms a negative feedback loop between the input and output terminals of the main amplifier 10 and includes first feedback capacitors 21. The input coupling circuit 30 includes input capacitors 30 coupled between first nodes N11 and N12 and the input terminals of the main amplifier 10. The bias circuit 40 applies a common voltage $V_{COM}$ to the input terminals of the main amplifier 10 through resistors 40.

The conventional amplifying device 1 may additionally perform a chopping operation according to a chopping frequency $f_{CHOP}$ to suppress noise and offset.

To this end, the main amplifier 10 includes a first chopping circuit 11 therein, and the first feedback circuit 20 may further include a second chopping circuit 22. A third chopping circuit 31 may be further included between input terminals of the conventional amplifying device 1 and the input coupling circuit 30.

Such a conventional amplifying device 1 can reduce power consumption, but has a limit in increasing input impedance.

The conventional amplifying device 1 may further include a second feedback circuit 50 to increase the input impedance.

The second feedback circuit 50 forms a positive feedback loop between the input and output terminals of the main amplifier 10, includes a second feedback capacitor 51, and further includes a fourth chopping circuit 52 for chopping operation.

The input impedance of the conventional amplifying device 1 is expressed as Equation 1.

$$Z_{in} = \frac{G}{s(G \cdot C_p + C_{in})} \qquad [\text{Equation 1}]$$

In Equation 1, s represents frequency component, $C_{in}$ represents capacitance of the input capacitor, and $C_p$ represents parasitic capacitance present in the first nodes N11 and N12. G corresponds to closed loop gain of the amplifying device 1 with first feedback loop 20 and is expressed as Equation 2.

$$G = \frac{A_0}{1 + A_0 \frac{C_{fb}}{C_{in}}} \qquad [\text{Equation 2}]$$

In Equation 2, $A_0$ represents gain of the main amplifier 10 and $C_{fb}$ represents capacitance of the first feedback capacitor 21.

If the gain of the main amplifier 10 is sufficiently large, the capacitance of the first feedback capacitor 21 corresponds to a value obtained by dividing the capacitance $C_{in}$ of the input capacitor by the gain G of the conventional amplifying device 1 according to Equation 2.

The input impedance of Equation 1 is affected by the gain G. That is, in the conventional amplifying device 1, the input impedance tends to increase as the gain G increases.

For example, when reading a signal from a sensor with high sensitivity, the gain G of the conventional amplifying device 1 may be lowered to prevent saturation of the output signal.

However, if the gain G of the conventional amplifying device 1 is lowered for the above reasons, the input impedance may be lowered, which may cause a problem in reading the signal output from the sensor.

SUMMARY

In accordance with the present teachings, an amplifying device may include a main amplifier; a first feedback circuit coupled between an input terminal of the main amplifier and an output terminal of the main amplifier; an input coupling circuit coupled between the input terminal of the main amplifier and a first node; and an amplifying feedback circuit coupled between the output terminal of the main amplifier and the first node, wherein the first feedback circuit and the amplifying feedback circuit are negative feedback circuits.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing embodiments consistent with this disclosure. The examples of the embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 1:
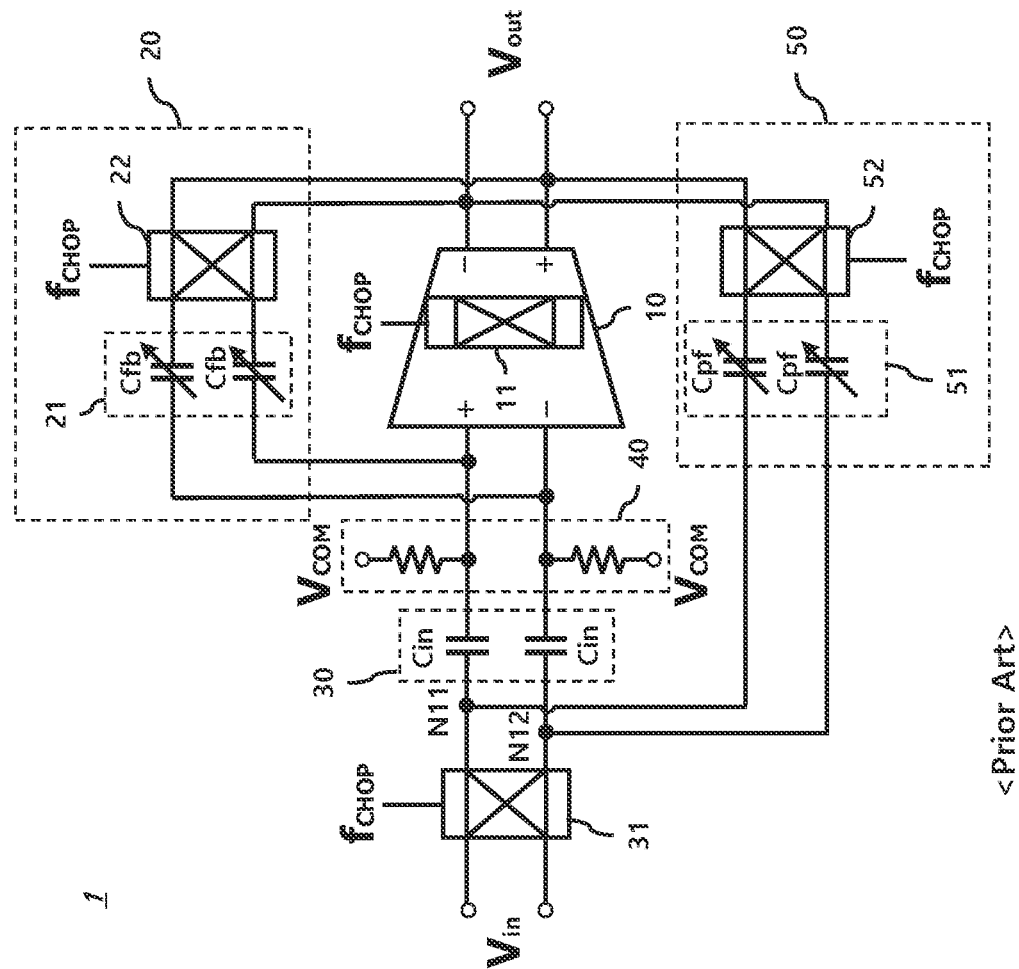
FIG. 1 shows a circuit diagram of a conventional amplifying device.
Figure 2:
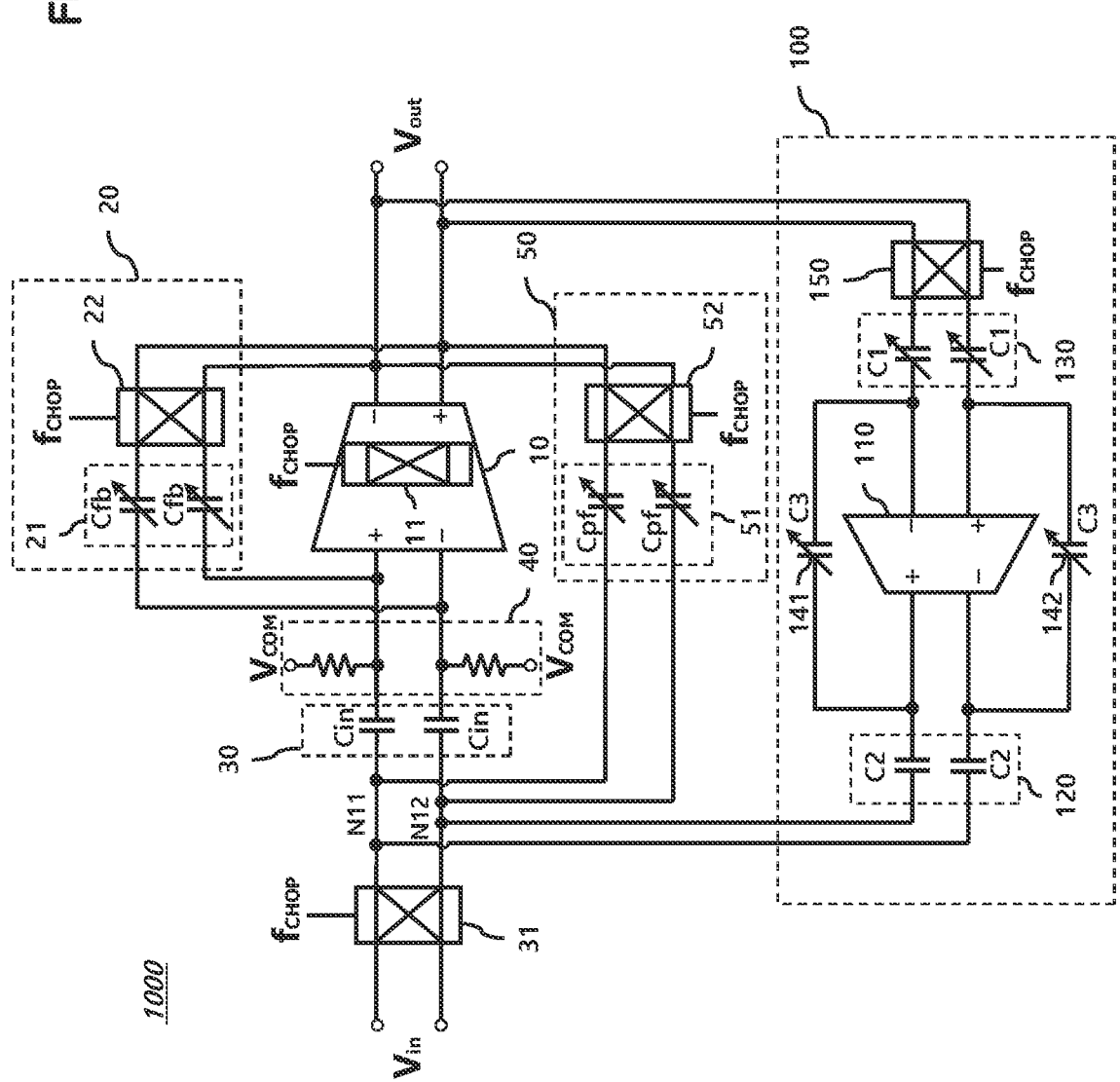
FIGS. 2 to 5 show circuit diagrams of an amplifying device according to an embodiment of the present disclosure.

FIG. 2 is a circuit diagram illustrating an amplifying device 1000 according to an embodiment of the present disclosure.

The amplifying device 1000 includes a main amplifier 10, a first feedback circuit 20, an input coupling circuit 30, and a bias circuit 40.

The main amplifier 10 is a differential amplifier and includes differential input terminals and differential output terminals.

The first feedback circuit 20 forms a negative feedback loop between the input and output terminals of the main amplifier 10 and includes first feedback capacitors 21. The input coupling circuit 30 includes input capacitors 30 coupled between first nodes N11 and N12 and the input terminals of the main amplifier 10. The bias circuit 40 applies a common voltage $V_{COM}$ to the input terminals of the main amplifier 10 through resistors 40.

The amplifying device 1000 may additionally perform a chopping operation according to a chopping frequency $f_{CHOP}$ to suppress noise and offset.

To this end, the main amplifier 10 includes a first chopping circuit 11 therein, and the first feedback circuit 20 may further include a second chopping circuit 22. A third chopping circuit 31 coupled between input terminals of the entire circuit and the input coupling circuit 30 may be further included.

The amplifying device 1000 may further include a second feedback circuit 50 to increase input impedance.

The second feedback circuit 50 forms a positive feedback loop between the input and output terminals of the main amplifier 10, includes a second feedback capacitor 51, and may further include a fourth chopping circuit 52 for chopping operation.

The amplifying device 1000 further includes an amplifying feedback circuit 100.

The feedback amplifier 110 includes a feedback amplifier 110, a feedback output capacitors 120, and a feedback input capacitors 130.

The feedback amplifier 110 is a differential amplifier and includes differential input terminals and differential output terminals.

The amplifying feedback circuit 100 increases input impedance of the amplifying device 1000.

The amplifying feedback circuit 100 feeds output signals of the main amplifier 10 back to the first nodes N11 and N12.

The first nodes N11 and N12 include an eleventh node N11 coupled to a positive input terminal of the main amplifier 10 and a twelfth node N12 coupled to a negative input terminal of the main amplifier 10.

In the present embodiment, when chopping operation is not performed, a positive output signal among the differential output signals of the feedback amplifier 110 is coupled to the twelfth node N12, and a negative output signal among the differential output signals of the feedback amplifier 110 is coupled to the eleventh node N11.

Accordingly, the amplifying feedback circuit 100 performs a negative feedback operation.

The feedback output capacitors 120 couples the output terminals of the feedback amplifier 110 and the first nodes N11 and N12.

The feedback input capacitors 130 couples the input terminals of the feedback amplifier 110 and the output terminals of the main amplifier 10.

In this embodiment, an input terminals and an output terminals of the feedback amplifier 110 are coupled via the amplifying feedback capacitors 141 and 142.

The amplifying feedback capacitor 141 couples the positive output terminal and the negative input terminal of the feedback amplifier 110, and the amplifying feedback capacitor 142 couples the negative output terminal and the positive input terminal of the feedback amplifier 110.

The amplifying feedback circuit 100 may further include a fifth chopping circuit 150 for a chopping operation.

The fifth chopping circuit 150 may be coupled between the output terminals of the main amplifier 10 and the feedback input capacitors 130 and operates according to the chopping frequency $f_{CHOP}$.

As described above, leakage current cannot be compensated because of parasitic capacitors present in the first nodes N11 and N12.

In the present embodiment, the amplifying feedback circuit 100 further increases input impedance by compensating for the leakage current by the parasitic capacitors present in the first nodes N11 and N12.

The input impedance of the amplifying device 1000 may be expressed as in Equation 3.

$$Z_{in} = \frac{1}{s\left[C_p - \left(\frac{G_{max}}{N} - \frac{G_{max}}{G} - 1\right)C_{unit}\right]} \quad \text{[Equation 3]}$$

Equation 3 assumes the following conditions.

$G_{max}$ is the maximum closed loop gain of the main amplifier 10 with first feedback loop 20, which is assumed to be 128 in this embodiment, and the gain of the amplifying device 1000 is indicated by G.

Each of the capacitance $C_1$ of the feedback input capacitor 130, the capacitance $C_{fb}$ of the first feedback capacitor 21, and the capacitance $C_{pf}$ of the second feedback capacitor 51 corresponds to the capacitance $C_{in}$ of the input capacitor included in the input coupling circuit 30 divided by the gain G of the amplifying device 1000.

The capacitance $C_{in}$ of the input capacitor included in the input coupling circuit 30 corresponds to $G_{max}$ times the unit capacitance $C_{unit}$.

The capacitance $C_2$ of the feedback output capacitor 120 is equal to the unit capacitance $C_{unit}$, and the capacitance $C_3$ of the amplifying feedback capacitors 141 and 142 is N times the unit capacitance $C_{unit}$, where N is a natural number.

Equations 1 and 3 can be used to compare effects of the conventional amplifying device 1 and the amplifying device 1000 according to the present embodiment.

Conventionally, input impedance is limited due to the parasitic capacitance $C_p$.

In the present embodiment, since there is a term that cancels the parasitic capacitance $C_p$ regardless of the voltage gain, it is possible to sufficiently increase the input impedance by reducing the influence of the parasitic capacitance $C_p$.

In addition, by appropriately selecting the unit capacitance $C_{unit}$ and N, the input impedance can be sufficiently increased even when the gain G of the amplifying device 2000 is small.

Figure 3:
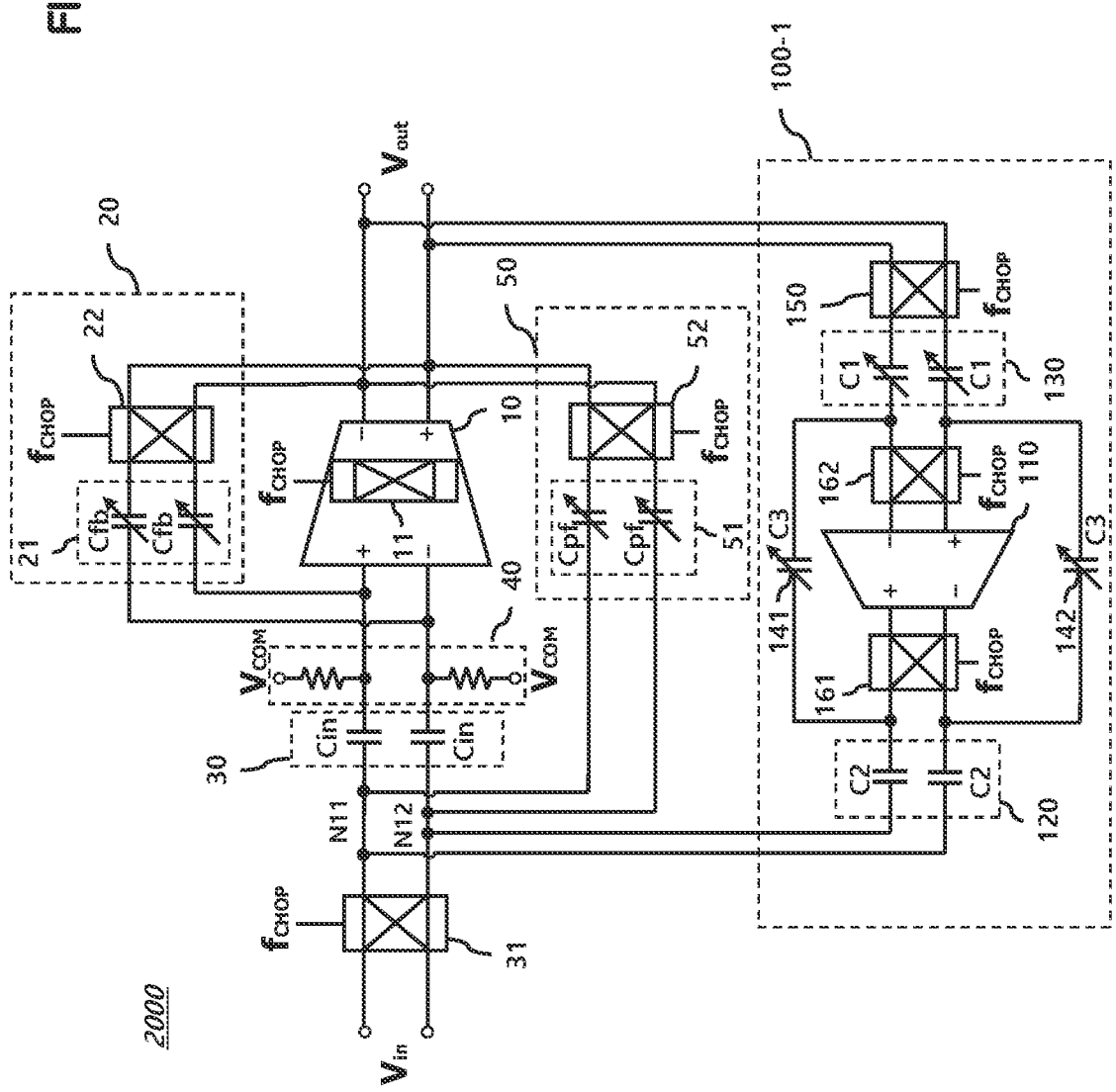

FIG. 3 shows an amplifying device 2000 according to an embodiment of the present disclosure.

The amplifying device 2000 of FIG. 3 is substantially the same as the amplifying device 1000 of FIG. 2 except that it further includes a chopping circuits 161 and 162.

In the embodiment of FIG. 3, the amplifying feedback circuit 100-1 further includes a sixth chopping circuit 161 between the output terminals of the feedback amplifier 110 and the feedback output capacitors 120, and a seventh chopping circuit 162 between the feedback input capacitors 130 and the input terminals of the feedback amplifier 110.

In the embodiment of FIG. 3, noise and offset of the feedback amplifier 110 may be further suppressed by the additional chopping operation of the sixth chopping circuit 161 and the seventh chopping circuit 162.

Since the input impedance boosting effect of the amplifying device 2000 is substantially the same as that of the amplifying device 1000, a repetitive description will be omitted.

Figure 4:
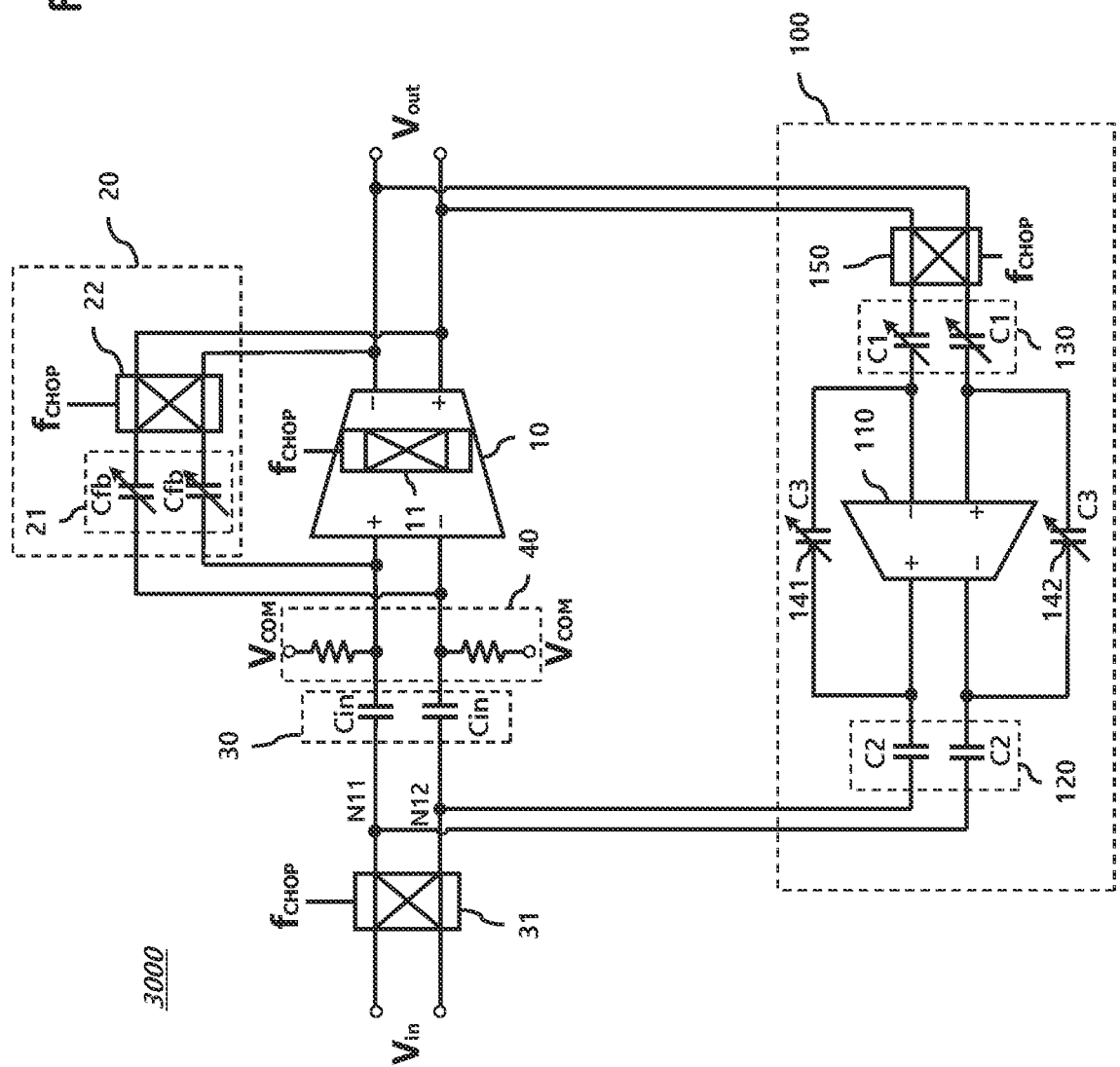
Figure 5:
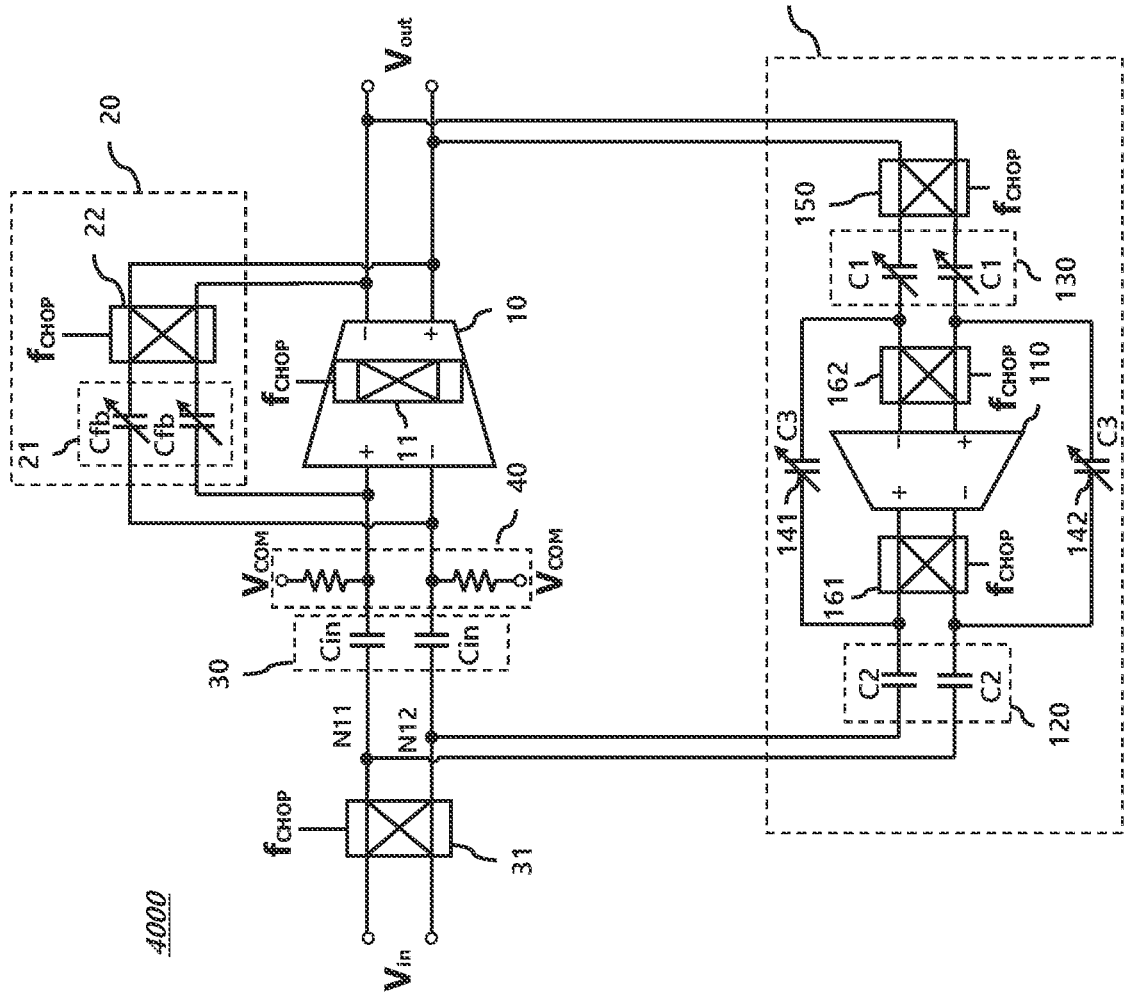

FIG. 4 shows an amplifying device 3000 and FIG. 5 shows an amplifying device 4000 according to embodiments of the present disclosure.

The amplifying device 3000 of FIG. 4 is a circuit in which the second feedback circuit 50 is omitted from the amplifying device 1000 of FIG. 2, and the amplifying device 4000 of FIG. 5 is a circuit in which the second feedback circuit 50 is omitted from the amplifying device 2000 of FIG. 3.

Since the detailed circuit configuration is the same as described above, repeated description thereof will be omitted.

When the second feedback circuit 50 is omitted, the input impedance is changed like Equation 4.

$$Z_{in} = \frac{1}{s\left[C_p + \frac{N-1}{N}C_{in} + C_{unit}\right]} \quad \text{[Equation 4]}$$

By setting the value of N to 1 in Equation 4, the influence of the input capacitance $C_{in}$ can be canceled.

This can relieve the limitation of input impedance due to input capacitance.

Figure 6:
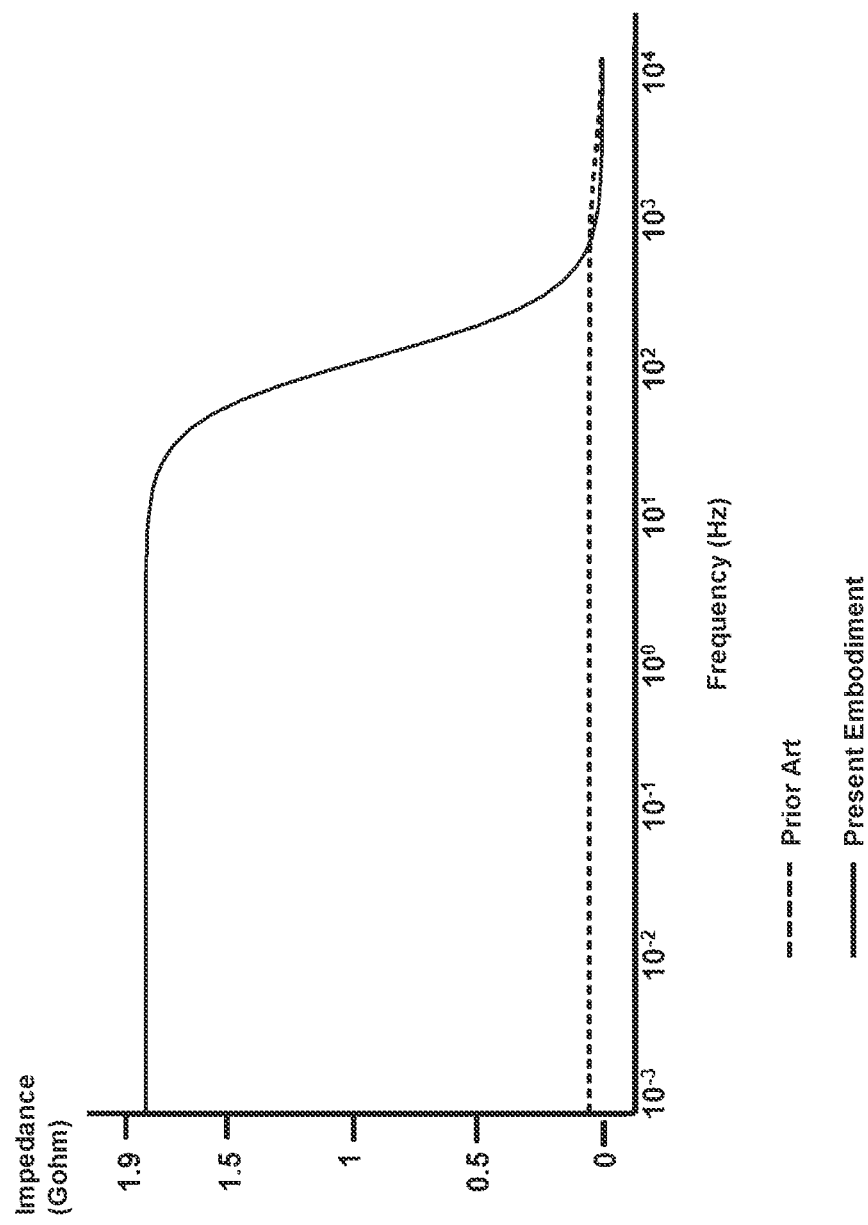
FIGS. 6 and 7 show graphs representing effects of an amplifying device according to an embodiment of the present disclosure.
Figure 7:
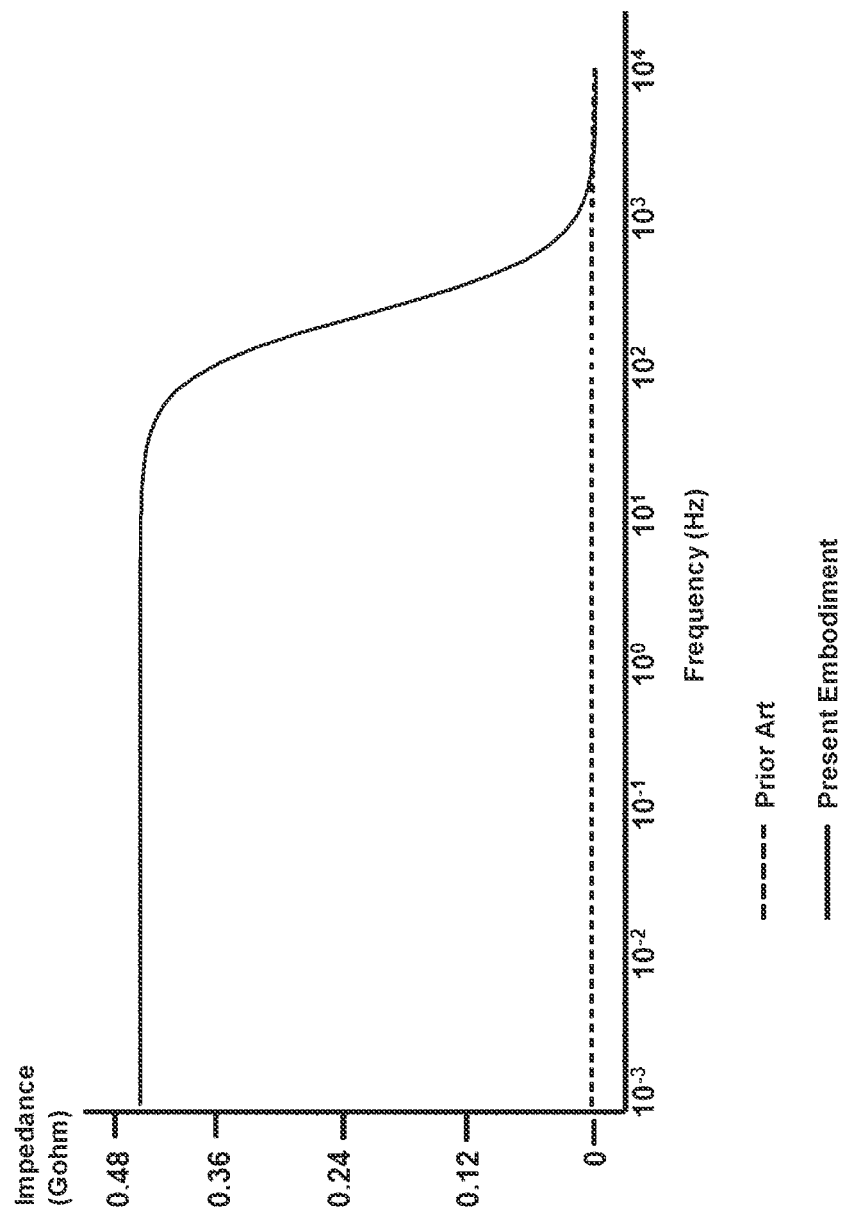

FIGS. 6 and 7 are graphs showing effects of the present embodiment.

In FIGS. 6 and 7, the horizontal axis indicates frequency and the vertical axis indicates impedance.

FIG. 6 corresponds to a case in which the closed loop gain of the amplifying device is 128, and FIG. 7 corresponds to a case in which the closed loop gain of the amplifying device is 8.

In FIGS. 6 and 7, the dotted line represents input impedance of the conventional amplifying device, and the solid line represents input impedance of the amplifying device according to a present embodiment. It can be seen that the impedance boosting effect of an amplifying device according to the present embodiment is large compared to conventional amplifying device.

In addition, it can be seen from FIGS. 6 and 7 that, in the case of the present embodiment, the impedance boosting effect is larger than that of the conventional amplifying device even when the gain of the amplifying device is small.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. An amplifying device comprising:
a main amplifier;
a first feedback circuit coupled between an input terminal of the main amplifier and an output terminal of the main amplifier;
an input coupling circuit coupled between the input terminal of the main amplifier and a first node; and
an amplifying feedback circuit coupled between the output terminal of the main amplifier and the first node,
wherein the first feedback circuit and the amplifying feedback circuit are negative feedback circuits, and
wherein the amplifying feedback circuit includes:
a feedback amplifier;
a feedback output capacitor coupled between an output terminal of the feedback amplifier and the first node;
a feedback input capacitor coupled between an input terminal of the feedback amplifier and the output terminal of the main amplifier; and
an amplifying feedback capacitor coupled between the input terminal of the feedback amplifier and the output terminal of the feedback amplifier.

2. The amplifying device of claim 1, wherein the input coupling circuit includes an input capacitor and the first feedback circuit includes a first feedback capacitor.

3. The amplifying device of claim 1, further comprising a bias circuit providing a common voltage to the input terminal of the main amplifier.

4. The amplifying device of claim 1, wherein the main amplifier is a differential amplifier, wherein each of the main amplifier and the first feedback circuit includes a chopping circuit therein, and wherein the amplifying device further includes a chopping circuit coupled to an input node thereof.

5. The amplifying device of claim 1, wherein the main amplifier and the feedback amplifier are differential amplifiers.

6. The amplifying device of claim 5, further comprising a chopping circuit coupled between the feedback input capacitor and the output terminal of the main amplifier.

7. The amplifying device of claim 6, further comprising a chopping circuit coupled between the feedback output capacitor and the output terminal of the feedback amplifier and a chopping circuit coupled between the feedback input capacitor and the input terminal of the feedback amplifier.

8. The amplifying device of claim 1, further comprising a second feedback circuit coupled between the output terminal of the main amplifier and the first node, wherein the second feedback circuit is a positive feedback circuit.

9. The amplifying device of claim 8, wherein the second feedback circuit includes a second capacitor coupled between the output terminal of the main amplifier and the first node.

10. The amplifying device of claim 9, wherein the main amplifier is a differential amplifier and the second feedback circuit further includes a chopping circuit coupled between the output terminal of the main amplifier and the second feedback capacitor.

* * * * *